(12) United States Patent
Nakamura

(10) Patent No.: US 8,841,936 B2
(45) Date of Patent: Sep. 23, 2014

(54) DIFFERENTIAL OUTPUT CIRCUIT AND SEMICONDUCTOR INTEGRATED CIRCUIT

(71) Applicant: Kabushiki Kaisha Toshiba, Tokyo (JP)

(72) Inventor: Yutaka Nakamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 13/768,975

(22) Filed: Feb. 15, 2013

(65) Prior Publication Data

US 2014/0028349 A1    Jan. 30, 2014

(30) Foreign Application Priority Data

Jul. 26, 2012 (JP) .................. 2012-166150

(51) Int. Cl.
*H03K 19/0185* (2006.01)
(52) U.S. Cl.
CPC .......... *H03K 19/018507* (2013.01); *H03K 19/018521* (2013.01)
USPC .............. 326/82; 326/86; 326/126; 326/127; 326/121; 327/108; 327/112
(58) Field of Classification Search
USPC .............. 326/82, 83, 86, 115, 119, 121, 126, 326/127; 327/108–112
See application file for complete search history.

(56) References Cited

U.S. PATENT DOCUMENTS

| | | | | |
|---|---|---|---|---|
| 6,812,736 B2 * | 11/2004 | Best et al. | ......... | 326/30 |
| 6,856,178 B1 * | 2/2005 | Narayan | ......... | 327/108 |
| 7,429,877 B2 * | 9/2008 | Arsovski et al. | ......... | 326/83 |
| 7,551,006 B2 * | 6/2009 | Muniyappa et al. | ......... | 327/108 |
| 7,573,299 B2 * | 8/2009 | Watarai | ......... | 326/83 |
| 7,825,694 B2 | 11/2010 | Katoh et al. | | |
| 7,893,719 B2 * | 2/2011 | Lee et al. | ......... | 326/86 |
| 7,961,014 B2 * | 6/2011 | Behel | ......... | 327/108 |
| 8,310,282 B2 * | 11/2012 | Behel | ......... | 327/108 |
| 8,461,882 B2 * | 6/2013 | Chang et al. | ......... | 327/108 |
| 8,466,718 B2 * | 6/2013 | Ezumi et al. | ......... | 327/108 |
| 2011/0248749 A1 | 10/2011 | Ezumi et al. | | |

FOREIGN PATENT DOCUMENTS

| | | |
|---|---|---|
| JP | 2010-087545 | 4/2010 |
| JP | 2010-157786 | 7/2010 |
| JP | 2011-223430 | 11/2011 |

* cited by examiner

*Primary Examiner* — Vibol Tan
(74) *Attorney, Agent, or Firm* — Holtz Holtz Goodman & Chick PC

(57) ABSTRACT

A differential output circuit has a current source, a voltage source, first paired transistors which, in a first operating mode, switch that current from the current source should be flown to which of paired output terminals, depending on logic levels of differential input signals, and is always turned off in a second operating mode, second paired transistors which, in the second operating mode, switch which of the paired output terminals should be applied with a voltage correlated with a voltage of the voltage source, depending on the logic levels of the differential input signals, and configured to be always turned off in the first operating mode, third paired transistors which, in the second operating mode, pass the current inputted into one of the paired output terminals toward a predetermined reference potential, and is always turned on in the first operating mode, and paired impedances.

20 Claims, 7 Drawing Sheets

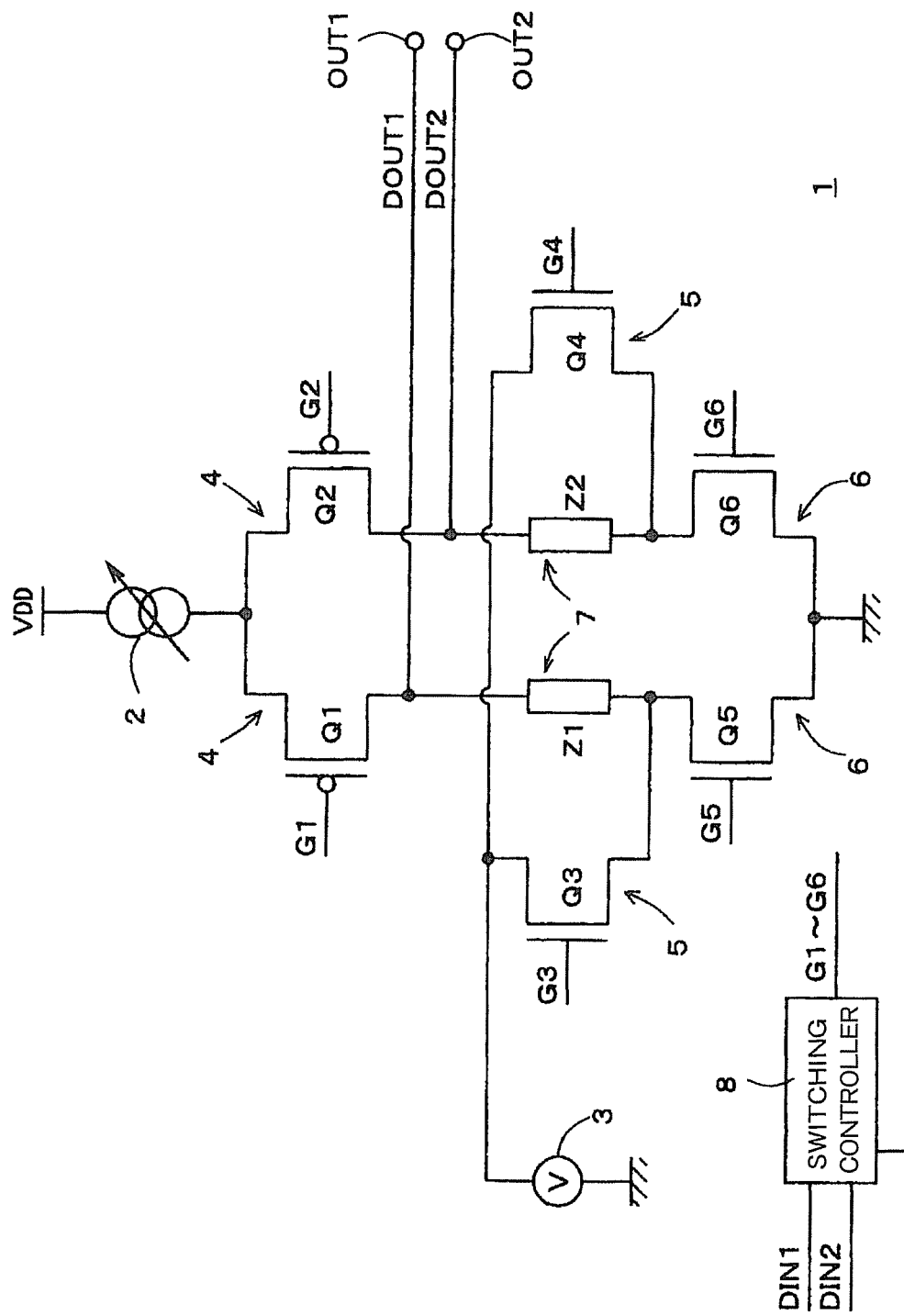
F I G. 1

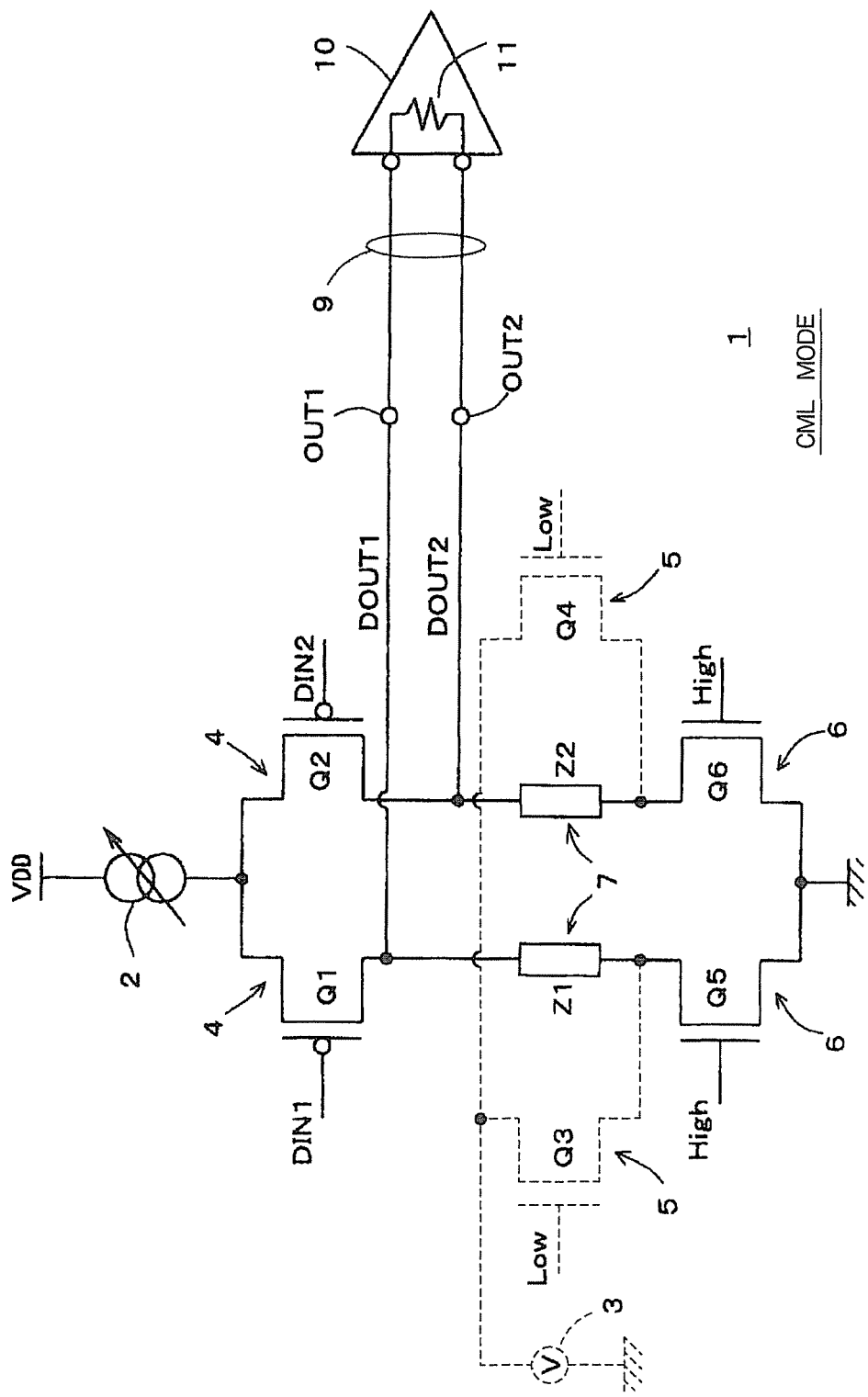
F I G. 2

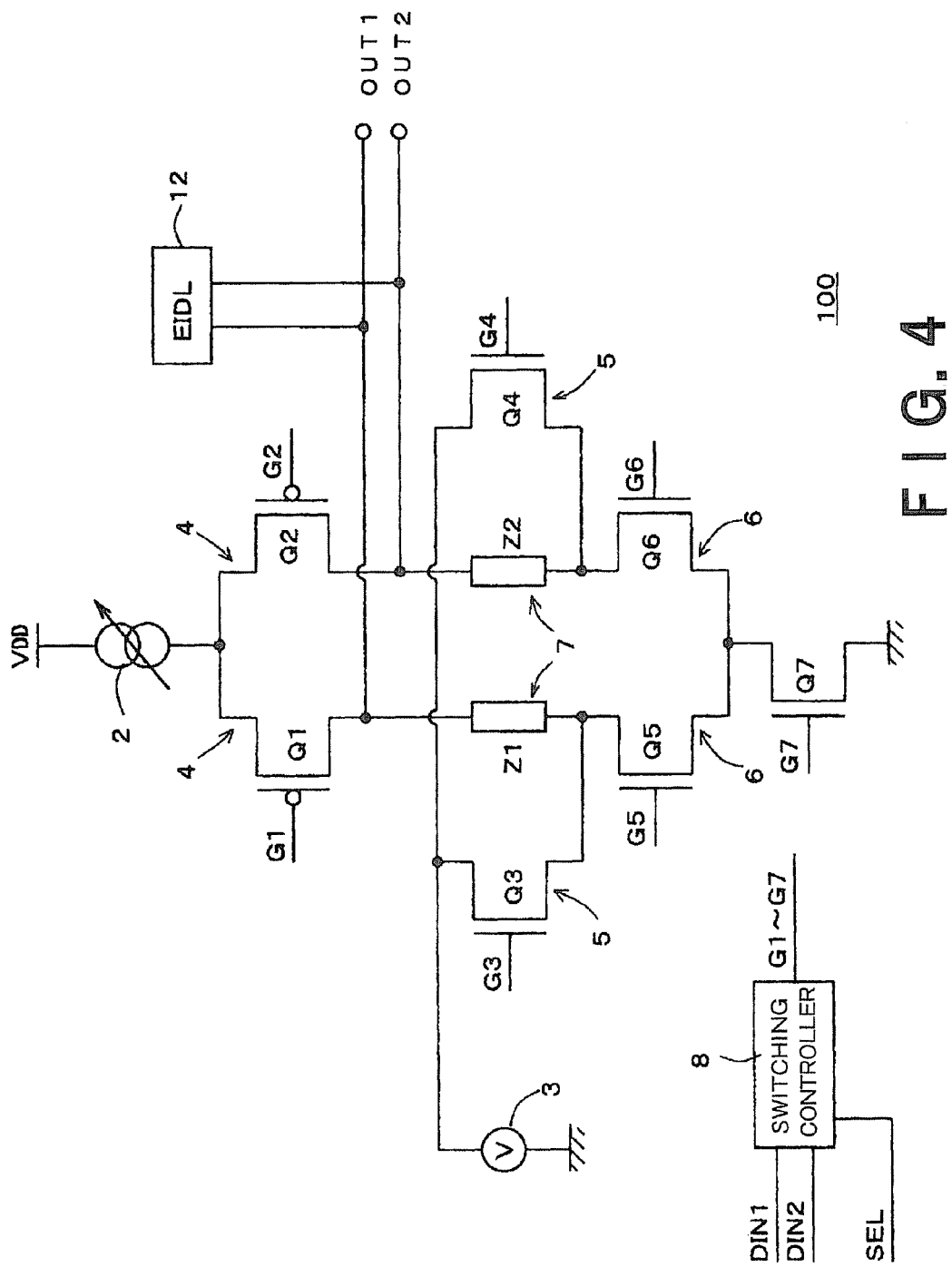
F I G. 4

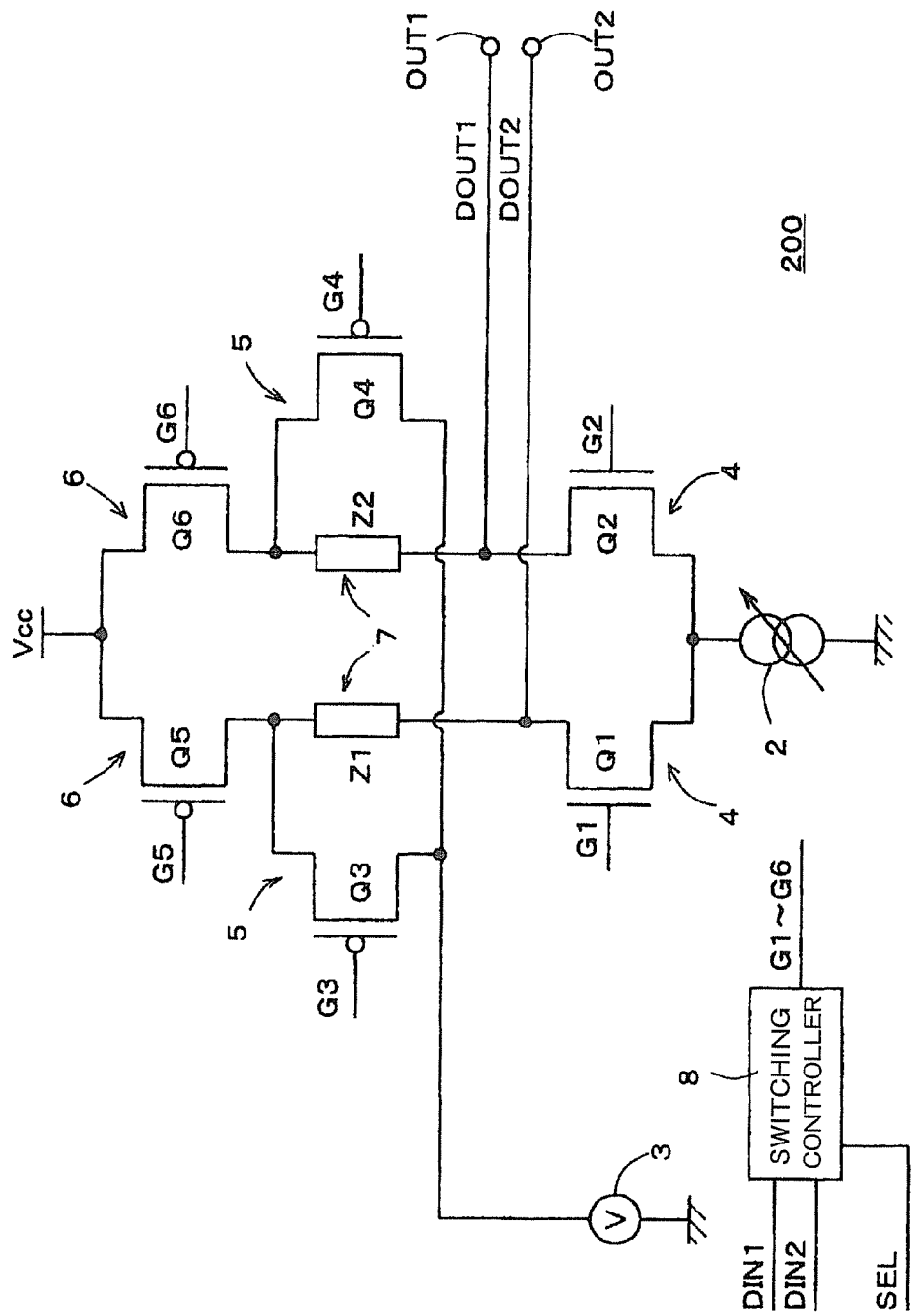
F I G. 5

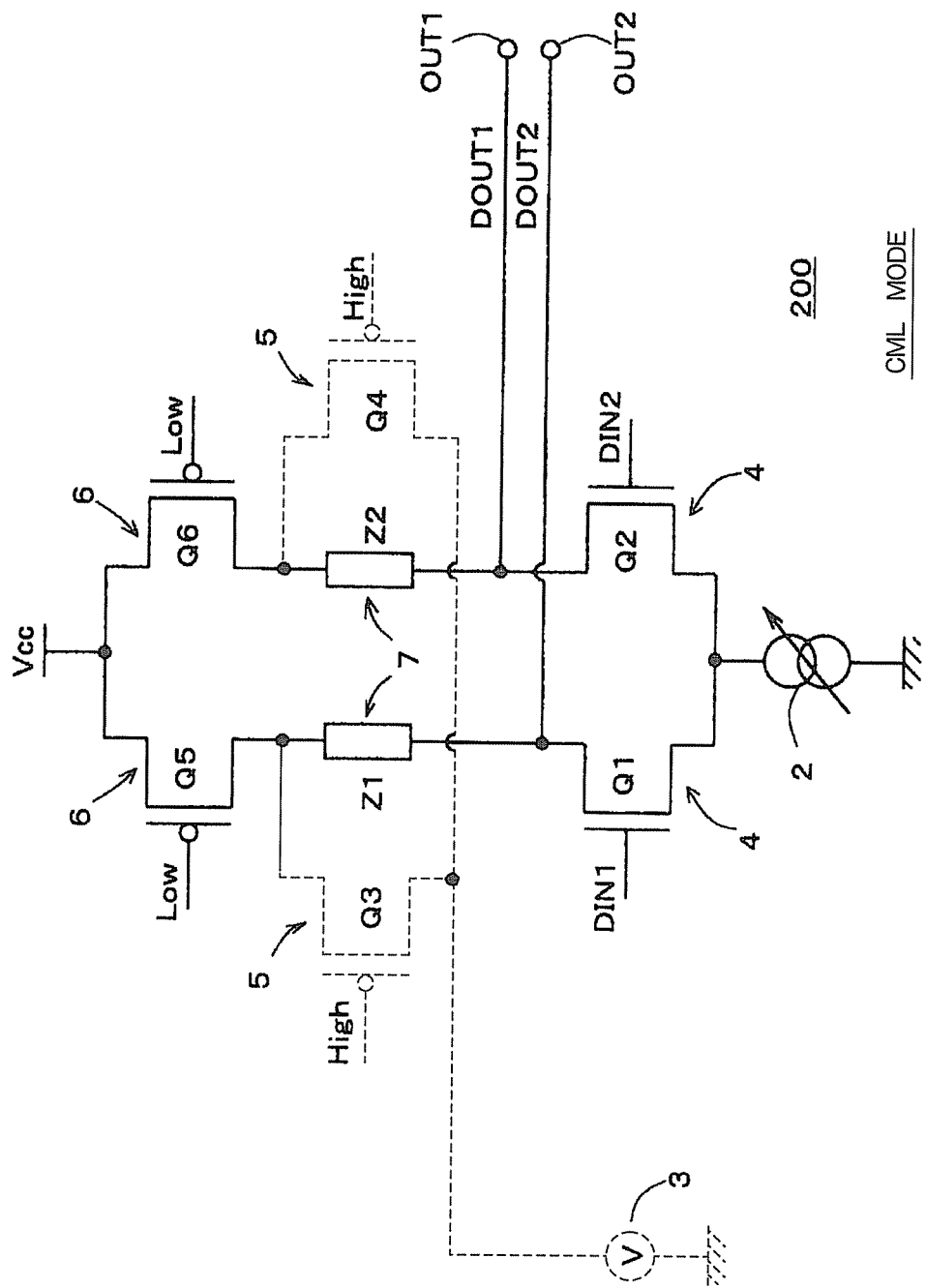
F I G. 6

DIFFERENTIAL OUTPUT CIRCUIT AND SEMICONDUCTOR INTEGRATED CIRCUIT

CROSS REFERENCE TO RELATED APPLICATIONS

This application is based upon and claims the benefit of priority from the prior Japanese Patent Application No. 2012-166150, filed on Jul. 26, 2012, the entire contents of which are incorporated herein by reference.

FIELD

Embodiments of the present invention relate to a differential output circuit and a semiconductor integrated circuit for generating differential output signals from differential input signals.

BACKGROUND

As performance of LSI chips such as CPU has been improved, processing speed of electronic devices has been up and volume of data handled by the electronic devices have been continuously increased. In view of such a background, various techniques have been developed to transmit large-volume data at high speed using a small number of signal lines.

LVDS (Low Voltage Differential Signal) is typical of such techniques. LVDS achieves a transmission speed of about 3 Gbps, but transmission speed higher than 3 Gbps has been requested in many cases recently. Upon such a request, a high-speed transmission system called CML (Current Mode Logic) has been developed.

On the other hand, there is a demand for reducing power consumption as much as possible by reducing the voltage magnitude in transmission, in priority to improvement of transmission speed. LVDS is not necessarily an optimum transmission system in terms of the reduction in power consumption.

As a technique to fulfill the demands for high-speed transmission and lower power consumption conflicting with each other, a technique of switching between LVDS and CML has been proposed. However, this technique is not excellent in terms of power consumption since LVDS itself requires high power consumption and CML further increases the high power consumption.

BRIEF DESCRIPTION OF THE DRAWINGS

FIG. 1 is a circuit diagram of a differential output circuit 1 according to a first embodiment.
FIG. 2 is a diagram showing the flow of signals of the differential output circuit 1 in a CML mode.
FIG. 4 is a circuit diagram of the differential output circuit 1 according to a second embodiment.
FIG. 5 is a circuit diagram of the differential output circuit 1 according to a third embodiment.
FIG. 6 is a circuit diagram of the differential output circuit 1 according to the third embodiment when operating in the CML mode.

DETAILED DESCRIPTION

Figure 3:
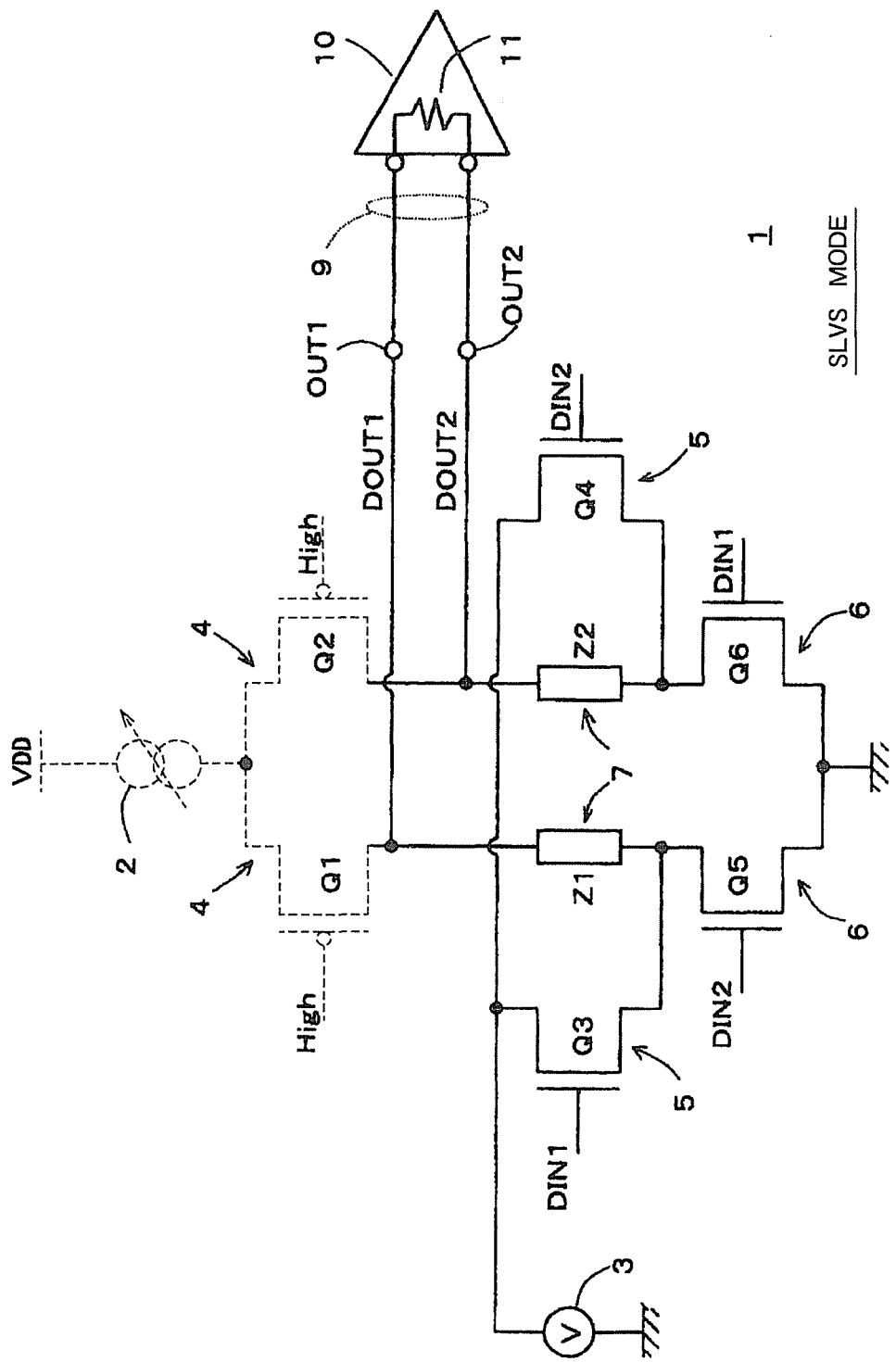
FIG. 3 is a diagram showing the flow of signals of the differential output circuit 1 in an SLVS mode.

A differential output circuit has a current source, a voltage source, first paired transistors which, in a first operating mode, switch that current from the current source should be flown to which of paired output terminals, depending on logic levels of differential input signals, and is always turned off in a second operating mode, second paired transistors which, in the second operating mode, switch which of the paired output terminals should be applied with a voltage correlated with a voltage of the voltage source, depending on the logic levels of the differential input signals, and is always turned off in the first operating mode, third paired transistors which, in the second operating mode, pass the current inputted into one of the paired output terminals toward a predetermined reference potential, depending on the logic levels of the differential input signals, and is always turned on in the first operating mode, the third paired transistors being connected to output current paths of the second paired transistors, and paired impedances which have one ends connected to the output current paths of the second paired transistors, and the other ends connected to output current paths of the first paired transistors and to the paired output terminals.

Embodiments of the present invention will now be explained referring to the drawings.

(First Embodiment)

FIG. 1 is a circuit diagram of a differential output circuit 1 according to a first embodiment. This differential output circuit is used as an output-stage circuit in a semiconductor integrated circuit, for example. Note that the differential output circuit 1 of FIG. 1 may be realized as a discrete circuit component mounted on a printed board etc.

The differential output circuit 1 of FIG. 1 has a feature in which a CML (Current Mode Logic) mode (first operating mode) realizing high-speed transmission and an SLVS (Scalable Low Voltage Signaling) mode (second operating mode) offering low-speed transmission but realizing reduction in power consumption can be arbitrarily switched. That is, the differential output circuit 1 of FIG. 1 is obtained by integrating a CML circuit operating in the CML mode with an SLVS circuit operating in the SLVS mode.

In the CML mode, a load connected to paired output terminals OUT1 and OUT2 is driven by current-control in order to facilitate a high-speed transmission at a rate of 3 Gbps or higher. On the other hand, in the SLVS mode, the load connected to the paired output terminals OUT1 and OUT2 is driven by voltage-control in order to transmit signals at a rate of 3 Gbps or lower with low power consumption.

Both in the CML mode and in SLVS mode, differential output signals DOUT1 and DOUT2 outputted from the paired output terminals OUT1 and OUT2 respectively can be set to a signal amplitude of about 400 mV. Further, power consumption can be more reduced in the SLVS mode, where the paired output terminals OUT1 and OUT2 are driven by voltage-control, than in an LVDS mode, where the paired output terminals OUT1 and OUT2 are driven by current-control.

The differential output circuit 1 of FIG. 1 has a current source 2, a voltage source 3, first paired transistors 4, second paired transistors 5, third paired transistors 6, paired impedances 7, and a switching controller 8.

In the CML mode, the first paired transistors 4 switch which of the paired output terminals OUT1 and OUT2 should receive the current from the current source 2, depending on the logic levels of differential input signals DIN1 and DIN2, and in the SLVS mode, the first paired transistors 4 are always turned off. The first paired transistors 4 are first and second transistors Q1 and Q2 each pMOS-type and having a source connected to the current source 2.

In the SLVS mode, the second paired transistors 5 switch which of the paired output terminals OUT1 and OUT2 should be applied with a voltage correlated with the voltage of the voltage source 3, depending on the logic levels of the differential input signals DIN1 and DIN2, and in the CML mode, the second paired transistors 5 are always turned off. The second paired transistors 5 are third and fourth transistors Q3 and Q4 each nMOS-type and having a drain connected to the voltage source 3.

The third paired transistors 6 are connected to the output current paths of the second paired transistors 5. In the SLVS mode, the third paired transistors 6 pass the current inputted into any one of the paired output terminals OUT1 and OUT2 toward a predetermined reference potential (e.g., ground potential), depending on the logic levels of the differential input signals DIN1 and DIN2, and in the CML mode, the third paired transistors 6 are always turned on. The third paired transistors 6 are nMOS-type fifth and sixth transistors Q5 and Q6 having sources connected to each other. In the example shown in FIG. 1, the sources of the fifth and sixth transistors Q5 and Q6 are set at a ground potential, but the sources of the fifth and sixth transistors Q5 and Q6 may not be necessarily connected directly to the reference potential such as the ground potential, but may be connected to the reference potential through another transistor as described later.

The paired impedances 7 have one ends connected to the output current paths of the second paired transistors 5, and the other ends connected to the output current paths of the first paired transistors 4 and to the paired output terminals OUT1 and OUT2. More concretely, one of the paired impedances 7 (first impedance element Z1) has one end connected to the source of the third transistor Q3 and to the drain of the fifth transistor Q5, and the other end connected to the drain of the first transistor Q1 and one of the paired output terminals OUT1 and OUT2 (first output terminal OUT1). The other of the paired impedances 7 (second impedance element Z2) has one end connected to the source of the fourth transistor Q4 and to the drain of the sixth transistor, and the other end connected to the drain of the second transistor Q2 and the other of the paired output terminals OUT1 and OUT2 (second output terminal OUT2).

Each of the first and second impedance elements Z1 and Z2 serving as the paired impedances 7 has a resistance value of 50Ω.

The switching controller 8 performs switching control for turning on and off each transistor included in the first paired transistors 4, second paired transistors 5, and third paired transistors 6, depending on the transfer mode selected. The switching controller 8 is inputted with the differential input signals DIN1 and DIN2 and a switching control signal SEL. The switching controller 8 determines the logic levels of gate signals G1 to G6 for the transistors Q1 to Q6, depending on the logic level of the switching control signal SEL. Accordingly, each of the gate signals G1 to G6 for the transistors Q1 to Q6 becomes a signal having the same logic level as any one of the differential input signals DIN1 and DIN2, or becomes a Low-level signal or a High-level signal.

FIG. 2 is a diagram showing the flow of signals of the differential output circuit 1 in the CML mode. In FIG. 2, transistors shown with broken lines are always turned off.

As shown in FIG. 2, in the CML mode, any one of the first transistor Q1 and second transistor Q2 serving as the first paired transistors 4 is turned on depending on the logic levels of the differential input signals DIN1 and DIN2, and the current from the current source 2 flows to any one of the paired output terminals OUT1 and OUT2 through the output current path (between the source and drain) of the first transistor Q1 or second transistor Q2 having been turned on.

In the CML mode, the second paired transistors 5 are always turned off and the third paired transistors 6 are always turned on, and thus the paired impedances 7 are connected between the paired output terminals OUT1 and OUT2 and a ground terminal.

The paired output terminals OUT1 and OUT2 are connected to differential input terminals of a receiver 10 through differential lines 9. A terminating resistance 11 of 100Ω is generally connected between the differential input terminals of the receiver 10. Therefore, when the first transistor Q1 of the first paired transistors 4 is turned on, for example, the current from the current source 2 is outputted from the first output terminal OUT1 through the output current path of the first transistor Q1. And then the current flows into the terminating resistance 11 in the receiver 10 through the differential line 9, and then flows into the second output terminal OUT2 through the differential line 9 again. Finally, the current flows into the ground terminal through the second impedance element Z2 and the output current path of the sixth transistor Q6.

As stated above, in the CML mode, the current from the current source 2 flows to the ground terminal through the first paired transistors 4, any one of the paired output terminals OUT1 and OUT2, the terminating resistance 11 in the receiver 10, the other of the paired output terminals OUT1 and OUT2, the paired impedances 7, and the third paired transistors 6 in this order.

FIG. 3 is a diagram showing the flow of signals of the differential output circuit 1 in the SLVS mode. In FIG. 3, the transistors indicated by broken lines are turned off. In the SLVS mode, the first paired transistors 4 are always turned off, any one of the third and fourth transistors Q3 and Q4 serving as the second paired transistors 5 is turned on depending on the logic levels of the differential input signals DIN1 and DIN2, and any one of the fifth and sixth transistors Q5 and Q6 serving as the third paired transistors 6 is turned on depending on the logic levels of the differential input signals DIN1 and DIN2.

More concretely, when the third transistor Q3 is turned on, the sixth transistor is turned on. In this case, the voltage from the voltage source 3 is applied to one end of the first impedance element Z1 through the third transistor Q3. The current generated by this voltage flows to the ground terminal through the other end of the first impedance element Z1, the first output terminal OUT1, the differential line 9, the terminating resistance 11 in the receiver 10, the differential line 9, the second output terminal OUT2, the second impedance element Z2, and the output current path of the sixth transistor Q6 in this order.

Further, when the fourth transistor Q4 is turned on, the fifth transistor Q5 is turned on. In this case, the voltage from the voltage source 3 is applied to one end of the second impedance element Z2. Current generated by this voltage flows to the ground terminal through the other end of the second impedance element Z2, the second output terminal OUT2, the differential line 9, the terminating resistance 11 in the receiver 10, the differential line 9, the first output terminal OUT1, the first impedance element Z1, and the output current path of the fifth transistor Q5 in this order.

As stated above, in the SLVS mode, the voltage from the voltage source 3 is applied to any one of the paired impedances 7 through any one of the second paired transistors 5, and thus the receiver 10 connected to the paired output terminals OUT1 and OUT2 is driven by voltage-control.

The switching controller 8 switches between the CML mode and the SLVS mode. The switching controller 8 can switch between the CML mode and the SLVS mode at arbitrary timing by changing the gate voltage of each of the first to third paired transistors 4 to 6.

According to the differential output circuit 1 of FIG. 1, both in the CML mode and in the SLVS mode, it is possible to output differential output signals DOUT1 and DOUT2 having a voltage magnitude of about 400 mV when common voltage is 0 V. On the other hand, differential output signals generated in the LVDS mode have a voltage magnitude of about 700 mV. Accordingly, it is possible to generate differential output signals DOUT1 and DOUT2 having a smaller amplitude than the LVDS mode, thereby reducing power consumption when signals are transmitted.

In the CML mode, the differential output circuit 1 of FIG. 1 uses the current source 2, first paired transistors 4, and paired impedances 7 so that the paired output terminals OUT1 and OUT2 are driven by current-control. On the other hand, in the SLVS mode, the voltage source 3, second paired transistors 5, third paired transistors 6, and paired impedances 7 are used so that the paired output terminals OUT1 and OUT2 are driven by voltage control.

As stated above, the paired impedances 7 are commonly used both in the CML mode and in the SLVS mode. Therefore, circuit scale can be reduced compared to the case where a differential output circuit 1 for the CML mode and a differential output circuit 1 for the SLVS mode are separately provided. The differential output circuit 1 according to the present embodiment is especially useful in a case of forming it in a semiconductor integrated circuit.

Further, in the present embodiment, the third paired transistors 6 are not necessary in the CML mode but always turned on in the CML mode while being connected to the output current paths of the first paired transistors 4 through the paired impedances 7. Thus, no problem is created in the CML mode operation although the third paired transistors 6 are connected to the output current paths of the first paired transistors 4.

By integrating a CML circuit with an SLVS circuit, the paired impedances 7 can be shared while reducing the number of wiring patterns, which leads to the reduction in the whole circuit area.

As stated above, according to the first embodiment, only one differential output circuit 1 is required to arbitrarily switch between the CML mode capable of conducting high-speed transmission and the SLVS mode realizing low power consumption. Accordingly, it is possible to arbitrarily switch between high-speed transmission and low power consuming transmission with a voltage magnitude smaller than the LVDS mode.

(Second Embodiment)

In some cases, when effective differential input signals DIN1 and DIN2 are not inputted into the differential output circuit 1, it is required to eliminate the potential difference between the differential output signals DOUT1 and DOUT2 outputted from the differential output circuit 1 and to set the potential at a specific level. In order to satisfy such requirements, it is desirable to connect an EIDL (Electrical Idle) circuit to the paired output terminals OUT1 and OUT2.

FIG. 4 is a circuit diagram of a differential output circuit 100 according to a second embodiment. The differential output circuit 100 also can be used as an output-stage circuit in a semiconductor integrated circuit, for example.

In addition to the components of FIG. 1, the differential output circuit 100 further has an EIDL circuit 12 connected to the paired output terminals OUT1 and OUT2, and a seventh transistor Q7 connected between the ground terminal and the sources of the fifth and sixth transistors Q5 and Q6 serving as the third paired transistors 6. The seventh transistor Q7 is turned on or off in each transfer mode by the switching control performed by the switching controller 8. Note that the same components as those in the differential output circuit 1 of FIG. 1 are given the same symbols, and detailed explanation thereof will be omitted.

When effective differential input signals DIN1 and DIN2 are not inputted into the differential output circuit 1 of FIG. 4, the seventh transistor Q7 is always turned off. That is, the seventh transistor Q7 is always turned on when the differential output circuit 1 performs normal differential output operation, and if not, the seventh transistor Q7 is always turned off.

When effective differential input signals DIN1 and DIN2 are not inputted into the differential output circuit 100, i.e. at a time of an IDLE state, the seventh transistor Q7 is always turned off, and the EIDL circuit 12 eliminates the potential difference between the paired output terminals OUT1 and OUT2 and sets the potential at a specific level.

When the seventh transistor Q7 is turned off, no current flows through the paired impedances 7 both in the CML mode and in the SLVS mode, which makes it possible to restrain the power consumption of the differential output circuit 100.

As stated above, according to the second embodiment, power consumption can be further reduced by arbitrary switching between the CML mode and the SLVS mode, and can add the EIDL circuit 12, thereby further reducing power consumption.

(Third Embodiment)

In the examples shown in the first and second embodiments, the differential output signals DOUT1 and DOUT2 to be outputted have a voltage magnitude of about 400 mV when common voltage is 0 V. On the other hand, power-supply voltage Vcc may be used as the common voltage to generate differential output signals DOUT1 and DOUT2 having a voltage magnitude between the power-supply voltage Vcc and a voltage lower than Vcc by about 400 mV.

FIG. 5 is a circuit diagram of a differential output circuit 200 according to a third embodiment. The differential output circuit 200 generates differential output signals DOUT1 and DOUT2 having a voltage magnitude between the power-supply voltage Vcc and a voltage lower than Vcc by about 400 mV.

In the differential output circuit 200, the connection relationship among the circuit elements connected between the power-supply voltage Vcc and the ground voltage is reverse to that of FIG. 1, and the conductivity type of each transistor is also reversed. Note that the same components as those in the differential output circuit 1 of FIG. 1 are given the same symbols, and detailed explanation thereof will be omitted.

One end of the current source 2 is set at the ground voltage, and the sources of the third paired transistors 6 are set at the power-supply voltage Vcc. The first and second transistors Q1 and Q2 serving as the first paired transistors 4 are nMOS-type, and the third and fourth transistors Q3 and Q4 serving as the second paired transistors 5 and the fifth and sixth transistors Q5 and Q6 serving as the third paired transistors 6 are pMOS-type.

FIG. 6 is a circuit diagram of the differential output circuit 200 when operating in the CML mode. In this case, similarly to FIG. 2, any one of the first paired transistors 4 is turned on depending on the logic levels of the differential input signals DIN1 and DIN2, and the current from the current source 2 flows to the paired output terminals OUT1 and OUT2. In the CML mode, the second paired transistors 5 are always turned off, and the third paired transistors 6 are always turned on.

Figure 7:
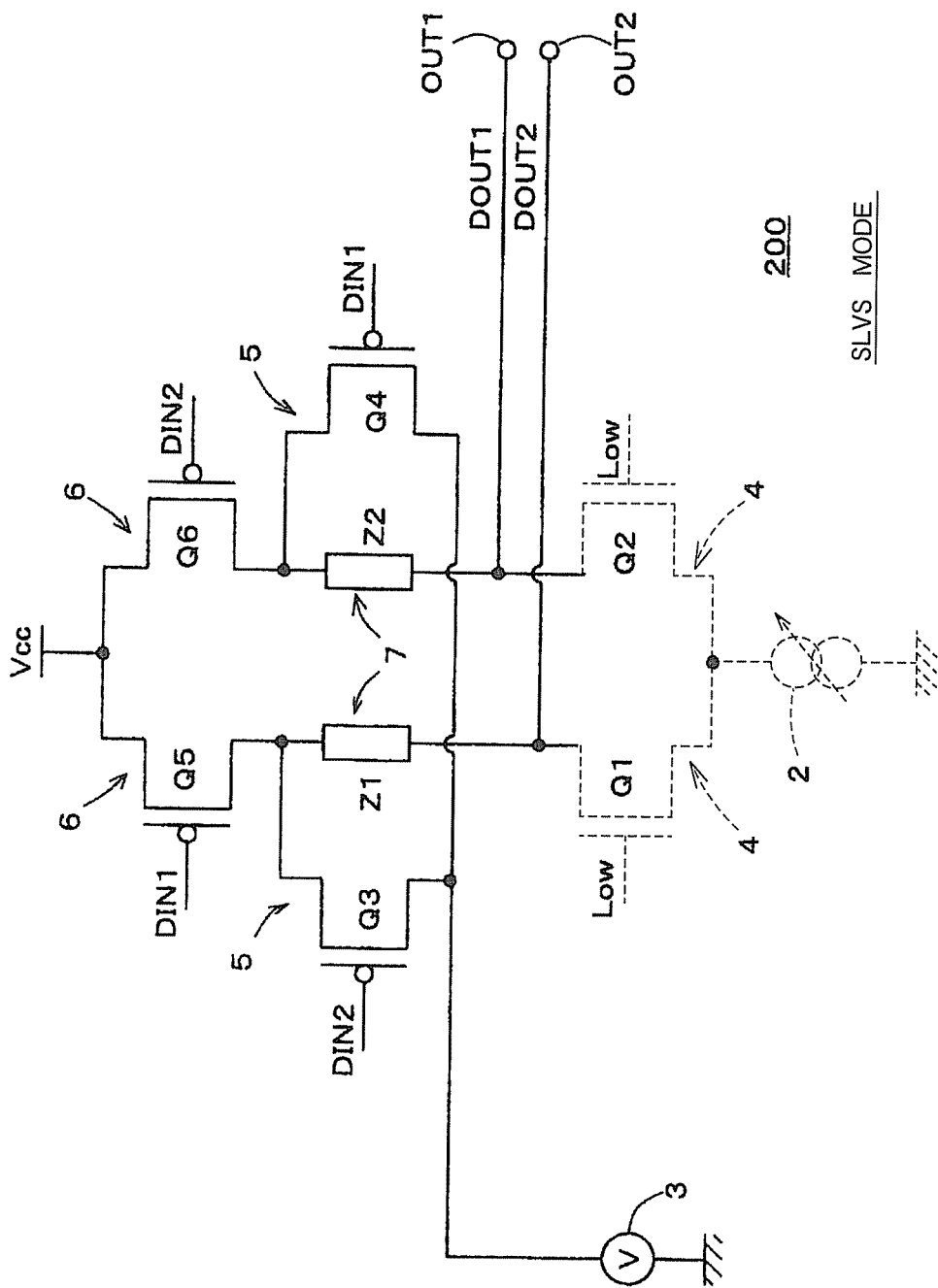
FIG. 7 is a circuit diagram of the differential output circuit 1 according to the third embodiment when operating in an SLVS mode.

FIG. 7 is a circuit diagram of the differential output circuit 1 according to the third embodiment when operating in the SLVS mode. In this case, similarly to FIG. 3, any one of the second paired transistors 5 and any one of the third paired transistors 6 are turned on depending on the logic levels of the differential input signals DIN1 and DIN2, and the paired output terminals OUT1 and OUT2 are driven by voltage-control. In the SLVS mode, the first paired transistors 4 are always turned off.

As stated above, in the third embodiment, even when the power-supply voltage Vcc is used as the common voltage, it is possible to generate differential output signals DOUT1 and DOUT2 having a voltage magnitude between the common voltage and a voltage lower than that by about 400 mV.

The differential output circuit according to the first to third embodiments may be incorporated into a semiconductor integrated circuit or may be formed as a discrete part, and can be widely applied to various uses (e.g., transmission of communication data, image data, memo data, etc. by a communication device.)

In the examples explained in the first to third embodiments, switching is arbitrarily performed between the CML mode and the SLVS mode, but a mode (e.g., LVDS mode) different from these two modes may be added to perform switching among three or more modes.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A differential output circuit comprising:
a current source;
a voltage source;
first paired transistors configured to, in a first operating mode, switch that current from the current source should be flown to which of paired output terminals, depending on logic levels of differential input signals, and configured to be always turned off in a second operating mode;
second paired transistors configured to, in the second operating mode, switch which of the paired output terminals should be applied with a voltage correlated with a voltage of the voltage source, depending on the logic levels of the differential input signals, and configured to be always turned off in the first operating mode;
third paired transistors configured to, in the second operating mode, pass the current inputted into one of the paired output terminals toward a predetermined reference potential, depending on the logic levels of the differential input signals, and configured to be always turned on in the first operating mode, the third paired transistors being connected to output current paths of the second paired transistors; and
paired impedances configured to have one ends connected to the output current paths of the second paired transistors, and the other ends connected to output current paths of the first paired transistors and to the paired output terminals.

2. The differential output circuit of claim 1, further comprising:
a switching controller configured to, in the first operating mode, perform switching control for turning on or off each transistor included in the first, second and third paired transistors so that current flows from the current source to any one of the paired output terminals through any one of the first paired transistors, and so that current inputted into the other of the paired output terminals flows into any one of the third paired transistors through any one of the paired impedances.

3. The differential output circuit of claim 1, further comprising:
a switching controller configured to, in the second operating mode, perform switching control for turning on or off each transistor included in the first, second and third paired transistors so that current flows from the voltage source to any one of the paired output terminals through the output current path of any one of the second paired transistors and through any one of the paired impedances, and so that current inputted into the other of the paired output terminals flows through the other of the paired impedances and through the output current path of any one of the third paired transistors.

4. The differential output circuit of claim 2,
wherein in the second operating mode, the switching controller performs switching control for turning on or off each transistor included in the first, second and third paired transistors so that current flows from the voltage source to any one of the paired output terminals through the output current path of any one of the second paired transistors and through any one of the paired impedances, and so that current inputted into the other of the paired output terminals flows through the other of the paired impedances and through the output current path of any one of the third paired transistors.

5. The differential output circuit of claim 1,
wherein in the first operating mode, one of the first paired transistors is turned on and the other is turned off depending on the logic levels of the differential input signals, and in the second operating mode, both of the transistors are always turned off,
in the first operating mode, both of the second paired transistors are always turned off, and in the second operating mode, one transistor is turned on and the other transistor is turned off depending on the logic levels of the differential input signals, and
in the first operating mode, both of the third paired transistors are always turned on, and in the second operating mode, one transistor is turned on and the other transistor is turned off depending on the logic levels of the differential input signals.

6. The differential output circuit of claim 1,
wherein the first operating mode is a CML (Current Mode Logic) mode for driving a load connected to the paired output terminals by current-control, and the second operating mode is an SLVS (Scalable Low Voltage Signaling) mode for driving the load connected to the paired output terminals by voltage-control.

7. The differential output circuit of claim 1,
wherein the first paired transistors comprise first-conductivity-type first and second transistors each comprising a source connected to the current source,
the second paired transistors are second-conductivity-type third and fourth transistors each comprising a drain connected to the voltage source,
the third paired transistors are second-conductivity-type fifth and sixth transistors comprising sources connected to each other, and
the paired impedances comprise:
a first impedance element comprising one end connected to a source of the third transistor and to a drain of the fifth transistor, and the other end connected to one of the paired output terminals and to a drain of the first transistor; and a second impedance element comprising one end connected to a source of the fourth transistor and to a drain of the sixth transistor, and the other end connected to the other of the paired output terminals and to a drain of the second transistor.

8. The differential output circuit of claim 7,
wherein in the first operating mode, the switching controller supplies the differential input signals to gates of the first and second transistors, turns off the third and fourth transistors, and turns on the fifth and sixth transistors, and in the second operating mode, the switching controller turns off the first and second transistors, supplies the differential input signals to gates of the third and fourth transistors, and supplies the differential input signals to gates of the fifth and sixth transistors.

9. The differential output circuit of claim 8,
wherein in the second operating mode, the switching controller turns on the third and sixth transistors while turning off the fourth and fifth transistors, or turns off the third and sixth transistors while turning on the fourth and fifth transistors, depending on the logic levels of the differential input signals.

10. The differential output circuit of claim 1, further comprising:
a seventh transistor configured to be connected to output current paths of the third paired transistors in order to switch whether or not to cut off current flowing through the output current paths of the third paired transistors; and
an EIDL unit configured to set both of the paired output terminals at a predetermined potential when the seventh transistor is turned off and the current flowing through the output current paths of the third paired transistors is cut off.

11. A semiconductor integrated circuit comprising:
a current source;
a voltage source;
paired output terminals;
paired impedances connected to the paired output terminals;
a CML (Current Mode Logic) circuit configured to drive a load connected to the paired output terminals by current-control;
an SLVS (Scalable Low Voltage Signaling) circuit configured to drive the load connected to the paired output terminals by voltage-control; and
a switching controller configured to switch whether the CML circuit is operated or the SLVS circuit is operated,
the CML circuit and the SLVS circuit commonly using the paired impedances.

12. The semiconductor integrated circuit of claim 11,
wherein the CML circuit comprises first paired transistors configured to, in a first operating mode for operating the CML circuit, switch that current from the current source should be flown to which of paired output terminals, depending on logic levels of differential input signals, and configured to be always turned off in a second operating mode for operating the SLVS circuit; and
the SLVS circuit comprises:
second paired transistors configured to, in the second operating mode, switch which of the paired output terminals should be applied with a voltage correlated with a voltage of the voltage source, depending on the logic levels of the differential input signals, and configured to be always turned off in the first operating mode; and
third paired transistors configured to, in the second operating mode, pass the current inputted into one of the paired output terminals toward a predetermined reference potential, depending on the logic levels of the differential input signals, and configured to be always turned on in the first operating mode, the third paired transistors being connected to output current paths of the second paired transistors,
the paired impedances having one ends connected to the output current paths of the second paired transistors, and the other ends connected to output current paths of the first paired transistors and to the paired output terminals.

13. The semiconductor integrated circuit of claim 12, further comprising:
a switching controller configured to, in the first operating mode, perform switching control for turning on or off each transistor included in the first, second and third paired transistors so that current flows from the current source to any one of the paired output terminals through any one of the first paired transistors, and so that current inputted into the other of the paired output terminals flows into any one of the third paired transistors through any one of the paired impedances.

14. The semiconductor integrated circuit of claim 12, further comprising:
a switching controller configured to, in the second operating mode, perform switching control for turning on or off each transistor included in the first, second and third paired transistors so that current flows from the voltage source to any one of the paired output terminals through the output current path of any one of the second paired transistors and through any one of the paired impedances, and so that current inputted into the other of the paired output terminals flows through the other of the paired impedances and through the output current path of any one of the third paired transistors.

15. The semiconductor integrated circuit of claim 13,
wherein in the second operating mode, the switching controller performs switching control for turning on or off each transistor included in the first, second and third paired transistors so that current flows from the voltage source to any one of the paired output terminals through the output current path of any one of the second paired transistors and through any one of the paired impedances, and so that current inputted into the other of the paired output terminals flows through the other of the paired impedances and through the output current path of any one of the third paired transistors.

16. The semiconductor integrated circuit of claim 12,
wherein in the first operating mode, one of the first paired transistors is turned on and the other is turned off depending on the logic levels of the differential input signals, and in the second operating mode, both of the transistors are always turned off,
in the first operating mode, both of the second paired transistors are always turned off, and in the second operating mode, one transistor is turned on and the other transistor is turned off depending on the logic levels of the differential input signals, and
in the first operating mode, both of the third paired transistors are always turned on, and in the second operating mode, one transistor is turned on and the other is turned off depending on the logic levels of the differential input signals.

17. The semiconductor integrated circuit of claim 12,
wherein the first paired transistors comprise first-conductivity-type first and second transistors each comprising a source connected to the current source,
the second paired transistors are second-conductivity-type third and fourth transistors each comprising a drain connected to the voltage source,
the third paired transistors are second-conductivity-type fifth and sixth transistors comprising sources connected to each other, and
the paired impedances comprise:
a first impedance element comprising one end connected to a source of the third transistor and to a drain of the fifth transistor, and the other end connected to one of the paired output terminals and to a drain of the first transistor; and
a second impedance element comprising one end connected to a source of the fourth transistor and to a drain of the sixth transistor, and the other end connected to the other of the paired output terminals and to a drain of the second transistor.

18. The semiconductor integrated circuit of claim 17,
wherein in the first operating mode, the switching controller supplies the differential input signals to gates of the first and second transistors, turns off the third and fourth transistors, and turns on the fifth and sixth transistors, and in the second operating mode, the switching controller turns off the first and second transistors, supplies the differential input signals to gates of the third and fourth transistors, and supplies the differential input signals to gates of the fifth and sixth transistors.

19. The semiconductor integrated circuit of claim 18,
wherein in the second operating mode, the switching controller turns on the third and sixth transistors while turning off the fourth and fifth transistors, or turns off the third and sixth transistors while turning on the fourth and fifth transistors, depending on the logic levels of the differential input signals.

20. The semiconductor integrated circuit of claim 11, further comprising:
a seventh transistor configured to be connected to output current paths of the third paired transistors in order to switch whether or not to cut off current flowing through the output current paths of the third paired transistors; and
an EIDL unit configured to set both of the paired output terminals at a predetermined potential when the seventh transistor is turned off and the current flowing through the output current paths of the third paired transistors is cut off.

* * * * *